(12) United States Patent
Weggen et al.

(10) Patent No.: US 7,608,486 B2
(45) Date of Patent: Oct. 27, 2009

(54) DEVICE AND METHOD FOR ENCAPSULATING WITH ENCAPSULATING MATERIAL AND ELECTRONIC COMPONENT FIXED ON A CARRIER

(75) Inventors: Martin Herman Weggen, Doetinchem (NL); Michel Hendrikus Lambertus Teunissen, Herwen (NL); Wilhelmus Gerardus Jozef Gal, Kilder (NL)

(73) Assignee: Fico B.V., Duiven (NL)

( * ) Notice: Subject to any disclaimer, the term of this patent is extended or adjusted under 35 U.S.C. 154(b) by 379 days.

(21) Appl. No.: 10/541,715

(22) PCT Filed: Jan. 6, 2004

(86) PCT No.: PCT/NL2004/000005

§ 371 (c)(1),
(2), (4) Date: Dec. 29, 2005

(87) PCT Pub. No.: WO2004/070838

PCT Pub. Date: Aug. 19, 2004

(65) Prior Publication Data

US 2006/0160275 A1    Jul. 20, 2006

(30) Foreign Application Priority Data

Jan. 8, 2003    (NL) .................................. 1022323

(51) Int. Cl.
*H01L 21/56*    (2006.01)
*H01L 23/28*    (2006.01)

(52) U.S. Cl. ............... 438/126; 257/787; 257/E21.504; 257/E23.125

(58) Field of Classification Search .................. 425/128
See application file for complete search history.

(56) References Cited

U.S. PATENT DOCUMENTS

| | | | | |
|---|---|---|---|---|
| 5,920,768 | A | * | 7/1999 | Shintai ........................ 438/112 |
| 6,114,189 | A | * | 9/2000 | Chia et al. .................. 438/112 |
| 6,200,121 | B1 | * | 3/2001 | Tsuruta ....................... 425/127 |

FOREIGN PATENT DOCUMENTS

| | | |
|---|---|---|
| EP | 0 726 598 | 8/1996 |
| JP | 57128930 | 8/1982 |
| JP | 4-184944 | 7/1992 |
| JP | 07080895 | 3/1995 |
| JP | 07183317 | 7/1995 |
| JP | 07205214 | 8/1995 |
| WO | WO 01/17012 | 3/2001 |

* cited by examiner

*Primary Examiner*—Stephen W Smoot
(74) *Attorney, Agent, or Firm*—The Webb Law Firm

(57) ABSTRACT

The invention relates to a device for encapsulating with encapsulating material an electronic component, in particular a semiconductor, fixed on a carrier, comprising: two co-acting mould parts which are displaceable relative to each other between an encapsulating position, in which the mould parts, when closing onto the carrier, occupy a position for defining at least one mould cavity, and an opened position in which the mould parts are situated at a greater distance from each other than in the encapsulating position, and feed means for encapsulating material connecting onto the mould cavity. The invention also relates to a method for encapsulating with encapsulating material an electronic component fixed on a carrier.

11 Claims, 2 Drawing Sheets

DEVICE AND METHOD FOR ENCAPSULATING WITH ENCAPSULATING MATERIAL AND ELECTRONIC COMPONENT FIXED ON A CARRIER

BACKGROUND OF THE INVENTION

1) Field of the Invention

The present invention relates to a device for encapsulating an electronic component. The invention also relates to a method for encapsulating with encapsulating material an electronic component, in particular a semiconductor, fixed on a carrier.

2) Description of the Related Art

The encapsulating of an electronic component fixed on a carrier is a technique applied on a large scale, particularly in the production of semiconductors. More and more emphasis is being placed on the use of low-lead or lead-free soldering material on the carrier, which has less of an environmental impact but which has the drawback that it must be processed at higher temperatures than lead-containing soldering materials. This is a drawback at the position where the encapsulating material must later be released from the soldering material. One solution here for is feeding of an encapsulation via a separating element at the position where the carrier has to remain free of encapsulating material. Such a technique is known from, among others, the international patent application PCT/NL00/00458. In the method and device described in this publication use is made of a holder member which is displaceable between the mould parts of an encapsulating device and with which an edge of a carrier can be urged against one of the mould parts, whereupon the feed of encapsulating material takes place over the holder member. The thus proposed technique functions effectively but requires a complex construction of the device. Because of the load on the plunger housing (sleeve), it has to take a sufficiently sturdy form and a displacing mechanism there for also has to be fitted. In addition, there is a real possibility of loss of adhesion (delamination) of the carrier and the encapsulating material connecting onto the carrier at locations where this loss of adhesion is undesirable when the holder member is displaced after the encapsulating process to a position where the carrier can be taken out of the encapsulating device. A further drawback is that the prior art device can only be used for encapsulating components on one side of the plunger housing.

The object of the present invention is to provide a device and method which are simplified compared to the prior art and with which the existing advantages can be retained in combination with a simplified technique.

SUMMARY OF THE INVENTION

The invention provides for this purpose a structurally simple device. Although a displaceable component (the support) still also has to be accommodated in the mould part with the projecting edge, this component is less critical than the displaceable component in the mould part according to the prior art since it does not have to come into contact with the encapsulating material. The connection of the displaceable support to the associated mould part may have a free intermediate space because the encapsulating material flows over the projecting edge onto the carrier; the displaceable support plays no part in this phase (at the position where the encapsulating material flows onto the board or earlier during the route covered by the encapsulating material in the liquid phase). Compensation of possible variations in thickness of different carriers is possible by means of the proposed construction. Not only lead frames of metal, composite lead frames of synthetic resin and/or ceramic among other materials, but also lead frames of thinner foil can for instance be processed with the device according to the invention. Another very relevant advantage compared to the prior art is that the chance of undesirable delamination can be reduced considerably. Yet another advantage of the present invention is that it enables the positioning of the carrier in the mould part before it is urged to the projecting edge as the sides of the mould part that surround the support are stationary parts of the mould part and due to their stable position, this in contrast with the closest prior art highly reliable in their positioning. The present construction with stationary reference sides also enable the loading, positioning and off loading of the carriers from various sides. It is for instance possible to bring the carrier in, or to move it out, from the contact side of the mould part. In this case care has to be taken that the carrier is given an extra movement to bring it partially under the projecting edge. Alternatively it is also possible to bring the carrier in, or to move it out, parallel to the contact side of the mould part. This means sliding the carrier in or out the mould part directly under the projecting edge, making an extra movement for final positioning superfluous.

In a preferred variant the projecting edge is defined by a material strip assembled with a mould part, and this material strip is preferably assembled releasably with the mould part. Such a material strip can be manufactured simply and at very limited cost. In a releasable variant, in the case of wear, damage or change-over of a mould (for instance for processing a different product) the material strip or (when the mould part is provided with a plurality of material strips) the material strips can be exchanged. It is noted here that the material strip does not have to be fixed to the mould part but that a separate placing with relative positioning of mould part and material strip already gives a sufficient form of mutual connection. The material strip can moreover form a projecting edge on a plurality of sides, whereby carriers can be simultaneously placed and injected on a plurality of sides (for instance on two opposite sides of the material strip).

Depending on the embodiment thereof, the displaceable support forms a side of the receiving space for a part of the carrier. The carrier is after all located on the displaceable support, and this support will normally extend to a position under the projecting edge for the purpose of clamping the carrier between the projecting edge and the support.

The device is more preferably also provided with release means for displacing the carrier in the direction of the displaceable support. After feeding and curing of the encapsulating material, these release means can (at least when the relative distance between the displaceable support and the projecting edge is increased) displace the carrier relative to the projecting edge such that the cured runner of encapsulating material will therein be broken at the position of the transition from the projecting edge to the carrier. Since breaking of the runner (degating) takes place in the mould, the encapsulating material will not yet have to be fully cured. During the separation the encapsulating material can for instance still be in a sort of "rubber phase", which can be advantageous for separation. In addition, an additional device for separating the runner (degater) becomes unnecessary, including the transfer apparatus between the mould and such a degater. An alternative is degating of the encapsulated product in two stages. In a first degating stage thicker runners can for instance be released in the mould and in a second stage smaller subrunners can then be released outside the mould.

In a particular preferred embodiment the release means are formed by at least one pressure element arranged in the second mould part for displacement under bias. This pressure element can be connected to a control member which, in the situation of mould parts being closed together, urges the pressure element into a position where the pressure element lies clear of the carrier. Such release means require no separate drive; this is because moving apart of the mould parts activates the release means. The release means can engage as required at any desired location on the carrier or on an encapsulating part (formed by at least partly cured encapsulating material) injected onto the carrier.

The drive means for the displaceable support are preferably provided with a pressure limiter for maximizing a bias exerted by the support on the carrier. The clamping force of the carrier between the support and the projecting edge can thus be precisely controlled irrespective of the thickness (variation) of the carrier. The chance of an inadequate connection of the carrier to the projecting edge and the chance of damage to the carrier by applying an excessive clamping force can hereby be minimized.

In yet another preferred variant, the device is provided with a mould part drive for mutual displacement of the mould parts, which mould part drive comprises a control for regulating the distance between the mould parts. After having the mould parts close together, the mould parts can therefore be moved apart again over a limited distance to thus enable the method that will be further elucidated below.

The invention also provides a method for encapsulating with encapsulating material an electronic component, in particular a semiconductor, fixed on a carrier. By means of this method the advantages can be realized as already described above with reference to the device according to the present invention.

The feed of the liquid encapsulating material is herein at least partially defined by the projecting edge of the first mould part. This defining can means direct defining of the projecting edge on the encapsulating material but also an indirect defining (i.e. via for instance foil material). The application of foil material is however not essential in practice.

After a processing step, the encapsulating material will cure. This then makes it possible in a preferred variant of the method for the carrier with encapsulating material arranged thereon to be displaced relative to the projecting edge such that a cured strip of encapsulating material leading from the projecting edge to the carrier is broken by the displacement. It is desirable for this purpose that the carrier be displaced relative to the projecting edge in the direction of the part of the first mould part supporting the carrier. The projecting edge functions here as a cutting edge along which the separation is made in the (partially) cured encapsulating material. Alternatively, it is also possible for the carrier to be rotated relative to the projecting edge so as to thus make a separation in the encapsulating material.

When the first and second mould parts are then moved apart, the carrier with the encapsulation arranged thereon and the remaining part of the cured encapsulating material can be removed from the first mould part in the situation where they are separated from each other. The encapsulation and degating have thus taken place in a single device with a very good final result.

In a particular embodiment variant of the method according to the invention, after closing a second mould part onto the first mould part, the mould parts are moved apart a distance of 1 to 50 µm, where after the distance between the projecting edge and the part of the first mould part supporting the carrier is then reduced such that a part of the carrier is clamped with a controllable force between the part of the first mould part supporting the carrier and the projecting edge. In this preferred variant the closing force of the mould parts is no longer of any significance for the result of the sensitive clamping as applied in accordance with this preferred variant of the method. Another advantage is that very pressure-sensitive carriers (for instance of ceramic or soft materials such as foil material) can also be processed in this manner without notable problems.

BRIEF DESCRIPTION OF THE DRAWINGS

The invention will be further elucidated with reference to the non-limitative embodiments of the device according to the invention shown in the following figures, in which.

DETAILED DESCRIPTION OF THE PREFERRED EMBODIMENTS

Figure 1A:
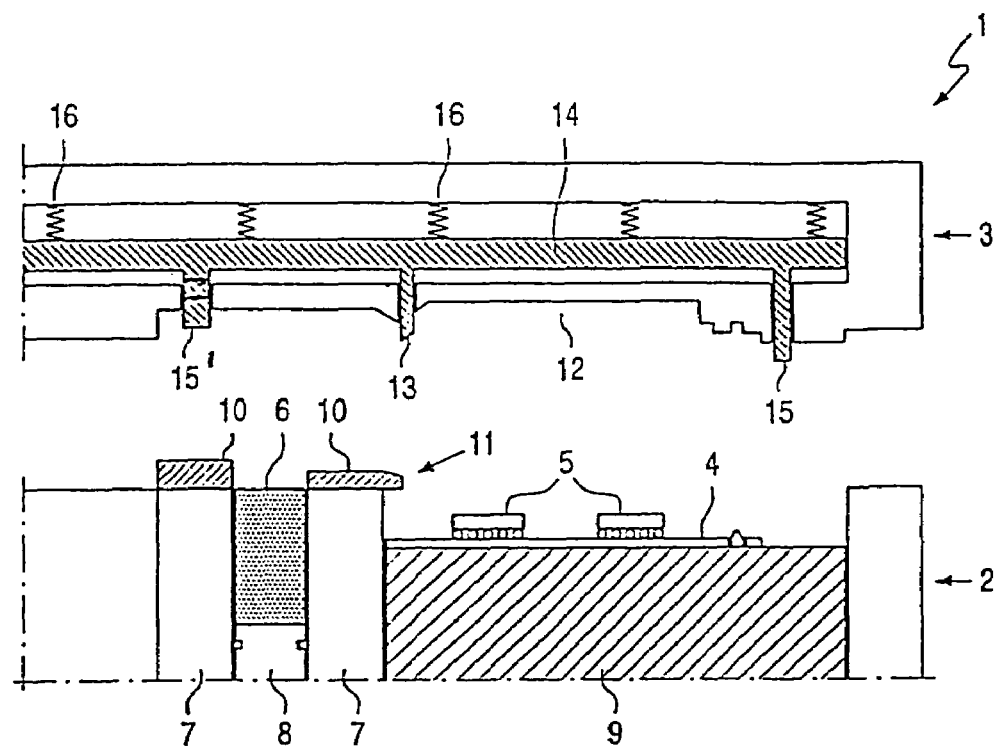
FIG. 1A shows a view of a cross-section through a schematically depicted encapsulating device according to the invention during placing of a carrier with components for encapsulating.

FIG. 1A shows a schematic view of an encapsulating device 1 with a lower mould part 2 and an upper mould part 3 which in the position shown here are moved apart to admit a carrier 4 on which are fixed electronic components 5 (in this case so-called flip chips). Also placed in lower mould part 2 is a pellet 6 of encapsulating material from which the housing to be injected for components 5 will be manufactured. Placing of carrier 4 in lower mould part 3 can take place manually, although this placing can also be mechanized.

The pellet 6 of encapsulating material is placed in a plunger housing 7 and supports on a displaceable plunger 8. Carrier 4 is placed on a displaceable support 9, this such that a portion 11 of a material strip 10 forming part of the lower mould part 2 protrudes partially to a position above carrier 4. Carrier 4 will hereby have to be placed with a non-linear movement in lower mould part 2.

The upper mould part 3 is provided with a mould cavity 12 with which the dimensions of the housing to be manufactured are determined. Protruding from upper mould part 3 is an ejector pin 13 mounted on an ejector bed 14. Ejector bed 14 is also provided with protruding pushers 15, 15' which have no function in the shown situation. Pusher 15' is herein provided with a construction such that the length thereof is variable under the influence of the force exerted thereon. Because no force is being exerted on pusher 15' in this figure, it has its maximum length. Ejector bed 14 is mounted displaceably via compression springs 16 in upper mould part 3 such that compression springs 16 urge ejector pin 13 to the shown position.

Figure 1B:
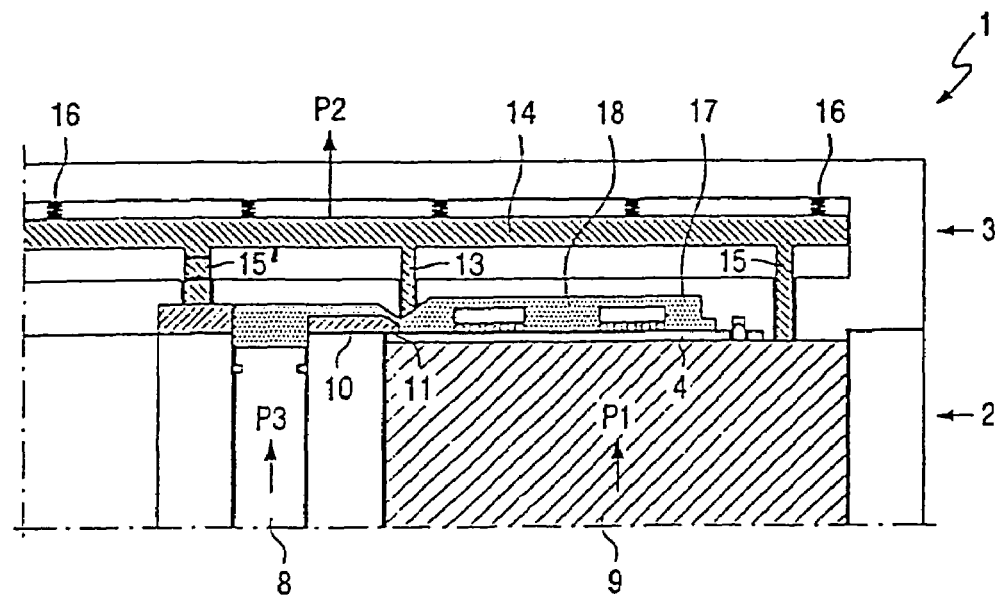
FIG. 1B is a view of a cross-section through the encapsulating device shown in FIG. 1A during curing of the supplied encapsulating material.

In FIG. 1B the mould halves 2, 3 are moved toward each other and displaceable support 9 is moved upward as according to arrow P1 such that carrier 4 is clamped between displaceable support 9 and the portion 11 of a material strip 10 protruding above carrier 4. Because the fit of displaceable support 9 in lower mould half 2 is not critical, it can be displaced practically without frictional resistance. The closing together of mould halves 2, 3 has the consequence that pusher 15 of ejector bed 14 comes into contact with the support 9 of lower mould part 2, which results in a displacement of ejector bed 14 in upper mould part 3 in a direction P2 counter to the bias of compression springs 16. The pressure on pusher 15' is relieved by the force exerted on pusher 15, whereby this now also has its maximum length. The result hereof is that ejector pin 13 is displaced to a position such that it no longer protrudes out of upper mould part 3.

After clamping of carrier 4 and closing together of mould halves 2, 3, the plunger 8 is then displaced as according to arrow P3, this usually in combination with heating (not shown) of the pellet 6 of encapsulating material. The encapsulating material 17, which has become liquid under the influence of temperature and pressure, then flows over the portion 11 of a material strip 10 protruding above carrier 4 into mould cavity 12.

Figure 1C:
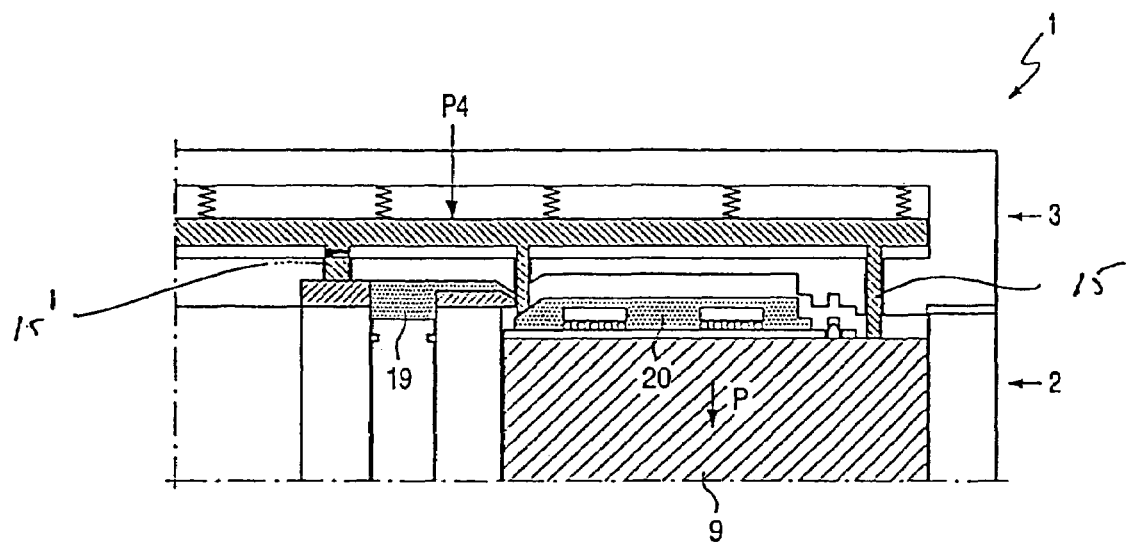
FIG. 1C is a view of a cross-section through the encapsulating device shown in FIGS. 1A and 1B after partial moving apart of the mould parts.

FIG. 1C shows the situation in which the encapsulating material 17 is at least partially cured. Mould halves 2, 3 are then moved apart over a limited distance and the support 9 is moved some distance downward, with the result that pusher 15 pushes the ejector bed 14, as according to arrow P4, less far into upper mould part 3: the consequence is that compression springs 16 will displace ejector bed 14 in upper mould part 3. Pusher 15' now has a shorter length; the force with which pusher 15' is compressed is chosen such that this force is smaller than that exerted by compression springs 16. The outward moving ejector pin 13 engages on an injected housing 18 around the electronic components 5. By also displacing the displaceable support 9 downward simultaneously (or sooner) as according to arrow P5, the space is created whereby the ejector pin 13 ensures separation of the runner of the encapsulating material. The limited opening of the mould halves thus results in degating of a runner with cured encapsulating material. The remaining part of encapsulating material 19 and the resulting product 20 can subsequently be taken out in separated state when mould halves 2, 3 are moved further apart.

Figure 2:
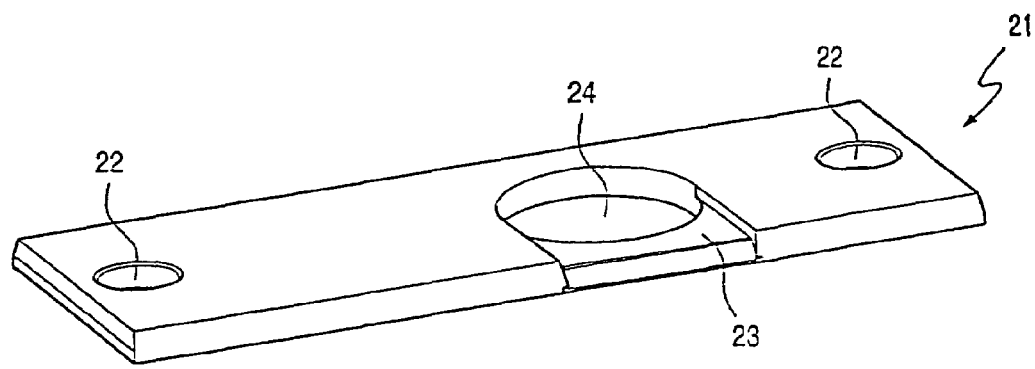
FIG. 2 is a perspective view of a projecting edge embodied as releasable element as component of an encapsulating device according to the invention.

Finally, FIG. 2 shows material strip 21 provided with fixing holes 22 for (releasable) anchoring to a mould half 2 (see FIGS. 1A-1C). Material strip 21 has a recessed part 23 over which encapsulating material can flow and which connects to an opening 24 in which a pellet 6 of encapsulating material can be placed.

Finally, FIG. 2 shows material strip 21 provided with fixing holes 22 for (releasable) anchoring to a mould half 2 (see FIGS. 1A-1C). Material strip 21 has a recessed part 23 over which encapsulating material can flow and which connects to an opening 24 in which a pellet 6 of encapsulating material can be placed.

The invention claimed is:

1. A device for encapsulating with encapsulating material an electronic component, in particular a semiconductor, fixed on a carrier, comprising:
   first and second co-acting mould parts which are displaceable relative to each other between an encapsulating position, in which the mould parts, when closing onto the carrier, occupy a position for defining at least one mould cavity that encloses at least a portion of the carrier, and an opened position in which the mould parts are situated at a greater distance from each other than in the encapsulating position, and
   feed means, for encapsulating material connecting onto at least one projecting edge under which is located a receiving space for a part of the carrier, wherein the projecting edge forms a stationary assembly with the first mould part, and the first mould part also receives a movable support for the carrier that is displaceable within the first mould part relative to the edge such that the carrier can be urged against the projecting edge with a controllable force.

2. The device as claimed in claim 1, wherein the projecting edge is defined by a material strip.

3. The device as claimed in claim 2, wherein the material strip is assembled releasably with a mould part.

4. The device as claimed in claim 1, wherein the displaceable support forms a side of the receiving space for a part of the carrier.

5. The device as claimed in claim 1, wherein the device is provided with release means for displacing the carrier in the direction of the displaceable support.

6. The device as claimed in claim 5, wherein the release means are formed by at least one pressure element arranged in one of the mould parts for displacement under bias.

7. The device as claimed in claim 6, wherein the pressure element is connected to a control member which, in the situation of mould parts being closed together, urges the pressure element into a position where the pressure element lies clear of the carrier.

8. A method for encapsulating with encapsulating material an electronic component, in particular a semiconductor, fixed on a carrier, comprising the processing steps of:
   A) placing the carrier on a first mould part such that at least one projecting edge connected to the first mould part lies on the side opposite the side of the carrier supporting on the first mould part,
   B) reducing the distance between the projecting edge and a support part of the first mould part supporting the carrier such that a part of the carrier is clamped between the part of the first mould part supporting the carrier and the projecting edge,
   C) closing a second mould part onto the first mould part such that at least one mould cavity is formed closing onto the carrier, and
   D) feeding liquid encapsulating material to the mould cavity, wherein during step B) the support part is moved in the first mould part towards the projecting edge that is kept stationary.

9. The method as claimed in claim 8, wherein the carrier is rotated relative to the projecting edge.

10. The method as claimed in claim 8, wherein the first and second mould parts are moved apart and the carrier with the encapsulation arranged thereon and the remaining part of the cured encapsulating material are then removed from the first mould part in the situation where they are separated from each other.

11. The method as claimed in claim 8, wherein after closing a second mould part onto the first mould part as according to processing step C), the mould parts are moved apart a distance of 1 to 50 µm, whereafter the distance between the projecting edge and the support part of the first mould part supporting the carrier is reduced such that a part of the carrier is clamped with a controllable force between the support part of the first mould part and the projecting edge.

* * * * *

UNITED STATES PATENT AND TRADEMARK OFFICE
CERTIFICATE OF CORRECTION

| | |
|---|---|
| PATENT NO. | : 7,608,486 B2 |
| APPLICATION NO. | : 10/541715 |
| DATED | : October 27, 2009 |
| INVENTOR(S) | : Weggen et al. |

It is certified that error appears in the above-identified patent and that said Letters Patent is hereby corrected as shown below:

On the Title Page, Item (54) and Col. 1 lines 1-4 the TITLE should read as follows:

-- DEVICE AND METHOD FOR ENCAPSULATING WITH ENCAPSULATING MATERIAL AN ELECTRONIC COMPONENT FIXED ON A CARRIER --

Signed and Sealed this

Sixteenth Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,608,486 B2  Page 1 of 1
APPLICATION NO. : 10/541715
DATED : October 27, 2009
INVENTOR(S) : Weggen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 545 days.

Signed and Sealed this

Twelfth Day of October, 2010

David J. Kappos
*Director of the United States Patent and Trademark Office*